United States Patent [19]
Kim

[11] Patent Number: 5,898,212
[45] Date of Patent: Apr. 27, 1999

[54] LEAD FRAME AND SEMICONDUCTOR PACKAGE

[75] Inventor: Sun Dong Kim, Cheongju, Rep. of Korea

[73] Assignee: LG Semicon Co., Ltd., Cheongju, Rep. of Korea

[21] Appl. No.: 08/785,592

[22] Filed: Jan. 17, 1997

[30] Foreign Application Priority Data

Jun. 14, 1996 [KR] Rep. of Korea ...................... 96-21536

[51] Int. Cl.⁶ ................................................. H01L 23/495
[52] U.S. Cl. ............................ 257/666; 257/672; 257/787
[58] Field of Search ..................................... 257/666, 672, 257/787

[56] References Cited

U.S. PATENT DOCUMENTS 3,902,148  8/1975  Drees et al. ............................ 257/672
5,461,255  10/1995  Chan et al. ............................. 257/672

*Primary Examiner*—Mahshid Saadat
*Assistant Examiner*—S. V. Clark
*Attorney, Agent, or Firm*—Fleshner & Kim

[57] ABSTRACT

A lead frame includes a first lead and a second lead formed on the first lead. The second lead may comprise a conductive adhesive and a conductive layer attached to the first lead. Such leads may be used for a package where the second leads are exposed on the outside exterior of a molded resin and/or a semiconductor chip has a plurality of center chip pads.

21 Claims, 4 Drawing Sheets

LEAD FRAME AND SEMICONDUCTOR PACKAGE

TECHNICAL FIELD

The present invention relates to a lead frame and a semiconductor package, and in particular, to an improved lead frame for a bottom lead package.

BACKGROUND ART

FIG. 1 is a longitudinal cross-section of a conventional bottom lead semiconductor package. As shown in this drawing, a conventional bottom lead semiconductor package includes a semiconductor chip 1, and a lead 2 composed of a plurality of substrate-connected leads 2a on top surface of which the semiconductor chip 1 is mounted and the bottom surface of which is connected to the substrate (not illustrated). A plurality of chip-connected leads 2b extends from the substrate-connected leads 2a to be wire-bonded to the semiconductor chip 1.

An adhesive 3 bonds the semiconductor chip 1 on the top surface of the substrate-connected lead 2a of the lead 2. A plurality of wires 5 electrically connects the chip pads/ bonding pads (not illustrated) of the semiconductor chip 1 with the chip-connected leads 2b of the lead 2. A molding resin 4 molds a predetermined area including the wire-bonded semiconductor chip 1 and the two kinds of leads 2a, 2b of the lead 2 such that the bottom surfaces of the substrate-connected leads 2a of the lead frame are exposed on the bottom surface of the package body. The substrate-connected leads 2a of the lead 2 are down-set from the chip-connected leads 2b at a predetermined depth.

The semiconductor package having the above construction is described in detail in U.S. Pat. No. 5,428,248, assigned to the assignee of the present invention and whose disclosure is incorporated herein by reference. However, in the above conventional semiconductor package, when the chip pads are located at the sides of the semiconductor chip, a wire bonding can be carried out, but when the chip pads are located at the center thereof, it is not possible to carry out a wire bonding.

DISCLOSURE OF THE INVENTION

The present invention is achieved at least in part by a lead frame for an integrated chip package, comprising: a pair of guide rails separated by a predetermined distance; at least one dam bar connecting the pair of guide rails; a plurality of first leads extending from the dam bar, the first leads having a predetermined length; and a plurality of second leads, corresponding second lead being formed on a predetermined portion of a first surface of a corresponding first lead.

The present invention can be also achieved at least in part by a chip package, comprising: a) an integrated chip having first and second surfaces, a plurality of bond pads formed on the first surface; b) a plurality of leads, each lead including i) a first lead with first and second surfaces, the first surface of the first lead being attached to the first surface of the integrated chip, and ii) a second lead formed on a predetermined portion of the second surface of the first lead; means for conductive coupling the plurality of bond pads with the plurality of leads; and molding resin molding the integrated chip, plurality of leads and conductive coupling means, wherein a predetermined portion of the second leads is exposed on an outside surface of the molding resin.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
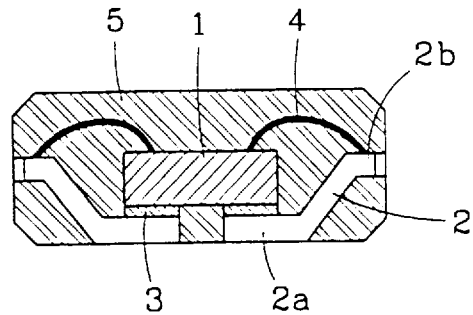
FIG. 1 is a longitudinal cross-sectional view of the conventional art.
Figure 2A:
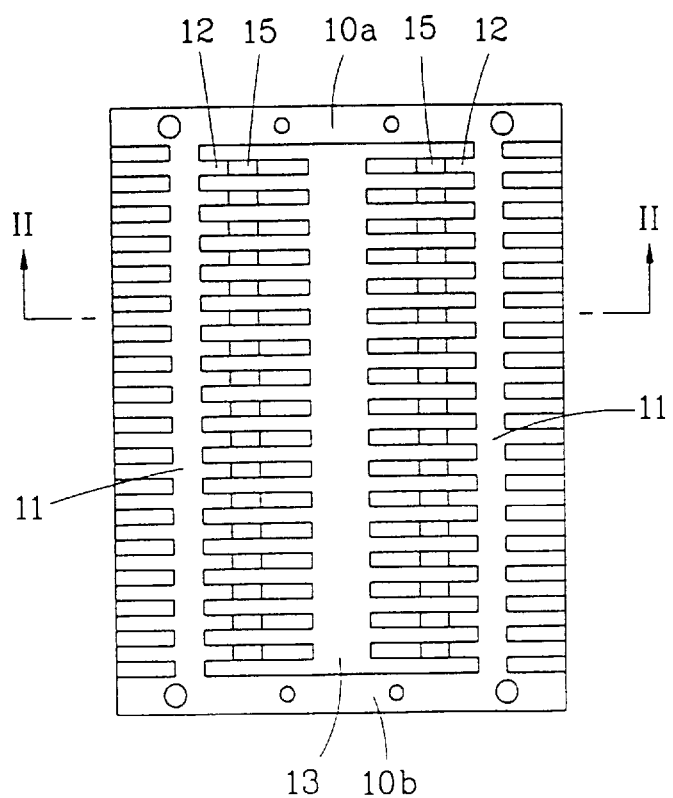
FIG. 2A is a planar view of a lead frame according to an embodiment of the present invention.
Figure 2B:
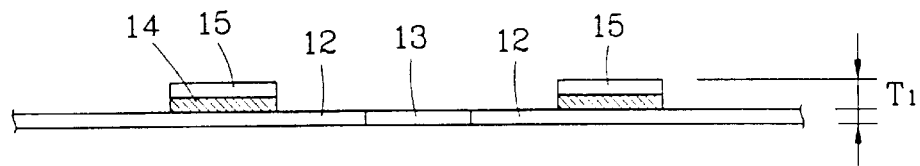
FIG. 2B is a cross-sectional view along line II—II of FIG. 2A.

As shown in FIGS. 2A and 2B, a pair of guide rails 10a, 10b are formed to be parallel having a predetermined distance therebetween, and serve as a transporting guide during the semiconductor package fabrication. A plurality of dam bars 11 vertically connected between the guide rails 10a and 10b are formed to have a predetermined length between a pair of guide rails. The dam bars 11 prevent the molding resin from filtering into the other places during the semiconductor package fabrication.

A plurality of first leads 12 extend from the sides of the dam bars 11. The first leads 12 are formed to be parallel with the guide rails 10a, 10b. The first leads 12 have a predetermined length, so that a predetermined width is kept between the first leads 12 formed at the other side. As a result, a predetermined area of resultant space 13 parallel with the dam bars is formed between the dam bars 11.

A conductive adhesive 14 is formed at the center of the top surface of each first leads 12, and a second lead 15 is bonded on the top surfaces of the conductive adhesives 14. A conductive double-sided tape is used as the conductive adhesive 14 to firmly bond the first leads 12 and second leads 15. A predetermined height difference T1 exists between the first and second leads 12 and 15.

Figure 3A:
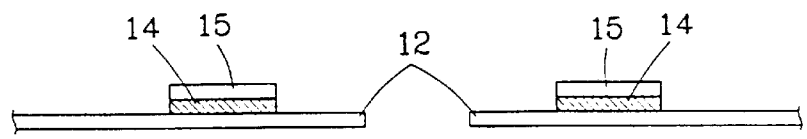
FIGS. 3A through 3D are cross-sectional views showing a fabrication process for a bottom lead semiconductor package using the lead frame in FIGS. 2 and a construction of the same according to the present invention.

FIGS. 3A through 3D are cross-sectional views of the semiconductor package fabrication process. As shown in FIG. 3A, there is provided a lead frame in which the conductive adhesive 14 is formed at the center of the top surfaces of the first leads 12, and the second leads 15 are formed on the upper surface of the conductive adhesive 14.

Figure 3B:
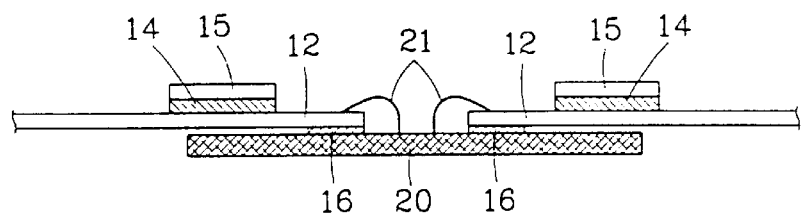

Next, as shown in FIG. 3B, an insulating double-sided tape is bonded on the bottom surfaces of the first leads 12 of the lead frame. Using the adhesive strength of the double-sided tape, a semiconductor chip having center pads is bonded on the bottom surfaces of the first leads 12 such that the center pads thereof are exposed through the plurality of first leads 12 (that is, the space 13 in FIGS. 2A and 2B). The center pads of the semiconductor chip 20 and first leads 12 are connected through a plurality of conductive wires 21. The center/bond pads and the first leads can be connected by solder bumps or any other means known to be equivalent to one of ordinary skill in the art.

Figure 3C:
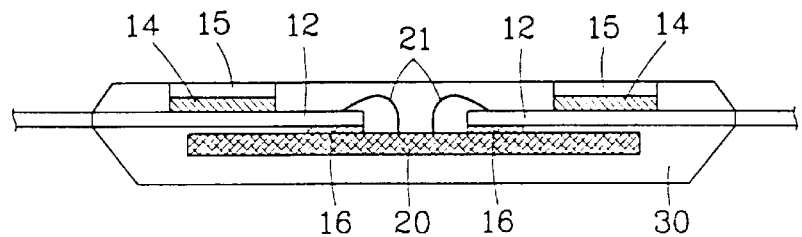
Figure 3D:
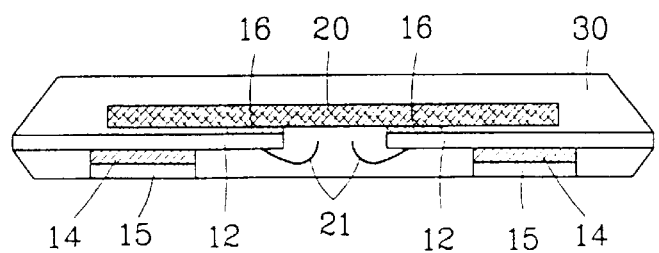

As shown in FIG. 3C, the semiconductor chip 20, the plurality of leads 12 and 15, and the conductive wires 21 are molded and sealed with a molding resin 30. The first leads 12 protruding out of the bordering portion of the molding resin 30 are cut off, resulting in a completed bottom lead semiconductor package, as shown in FIG. 3D. The molding process is performed such that the top surfaces of the second leads 15 are exposed for mounting the substrate (not illustrated) thereon for the purpose of transmitting an electrical signal of the semiconductor chip 20 to the outside.

As illustrated in FIG. 3D, the bottom lead semiconductor package according to an embodiment of the present invention includes the semiconductor chip 20 having a plurality of center pads formed thereon, and a plurality of first leads 12 bonded at both sides of the top surface of the semiconductor 20. A plurality of wires connects the first leads 12, and a plurality of conductive adhesives 14 are formed at the centers of the top surfaces of the first leads 12. A plurality of second leads 15 are bonded on the conductive adhesives 14, and the molding resin 30 molds the semiconductor chip 20 so that the top surfaces of the second leads 15 are exposed.

Figure 4A:
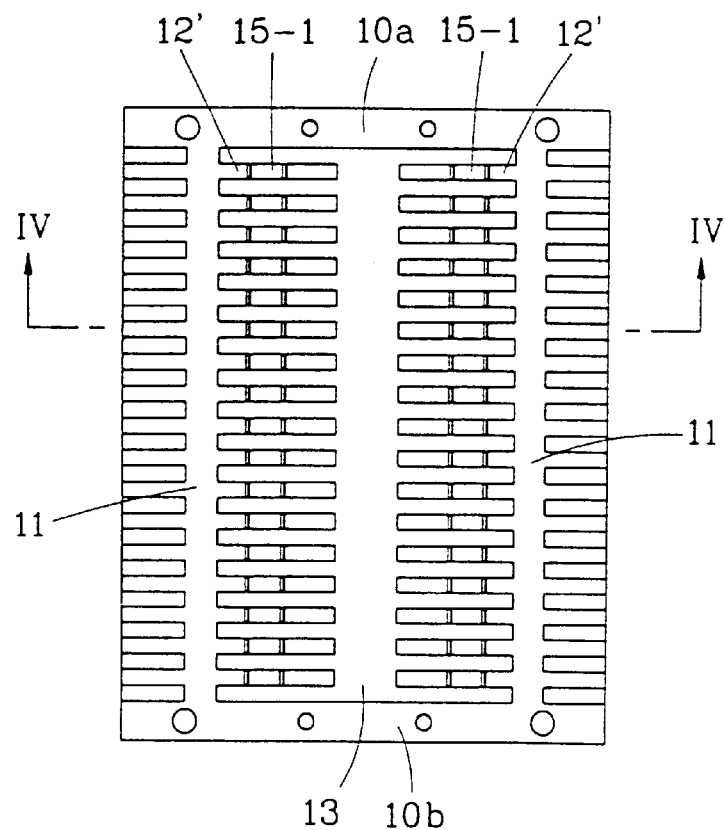
FIG. 4A is a planar view of a lead frame according to another embodiment of the present invention.
Figure 4B:
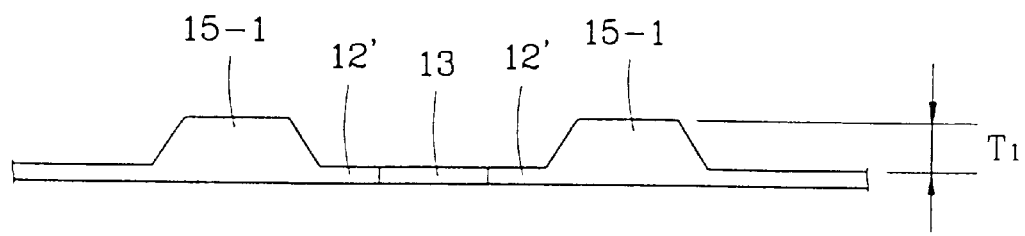
FIG. 4B is a cross-sectional view along line IV—IV of FIG. 4A.

FIG. 4A is a planar view of a lead frame according to another embodiment of the present invention, and FIG. 4B is a cross-sectional view of IV—IV line in FIG. 4A. A lead frame includes a pair of guide rails 10a, 10b formed to be parallel having a predetermined distance therebetween, and a plurality of dam bars 11 are vertically connected between the guide rails 10a and 10b. A plurality of first leads 12 are formed to be parallel with the guide rails 10a, 10b at the sides of the dam bars 11. Instead of the conductive adhesive 14 and the second leads 15 of FIG. 2A, the lead frame has first leads 12' of which the center portions are formed to protrude in the upper direction and has a prescribed thickness T2. A protrusion 15-1 is formed to be thicker than the leads 12' by the prescribed thickness T2 at the center of the leads 12' and serves as a bottom lead to be connected to the substrate (not illustrated) when the package is completed.

Figure 5A:
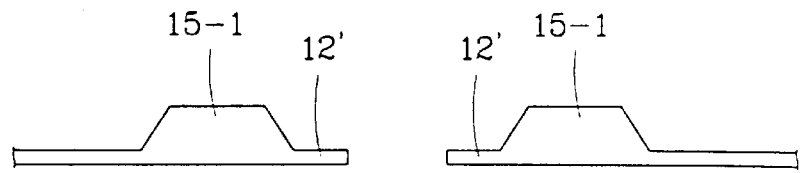
FIGS. 5A through 5D are cross-sectional views showing a fabrication process for a bottom lead semiconductor package using the lead frame in FIG. 4 and a construction of the same according to the present invention.

FIGS. 5A through 5D are cross-sectional views showing a fabrication process for a bottom lead semiconductor package using the lead frame in FIGS. 4 and a construction of the same according to the present invention. First, as shown in FIG. 5A, the lead frame identical to that in FIGS. 4A and 4B having a plurality of leads 12' formed to protrude at the center of the top surface is provided.

Figure 5B:
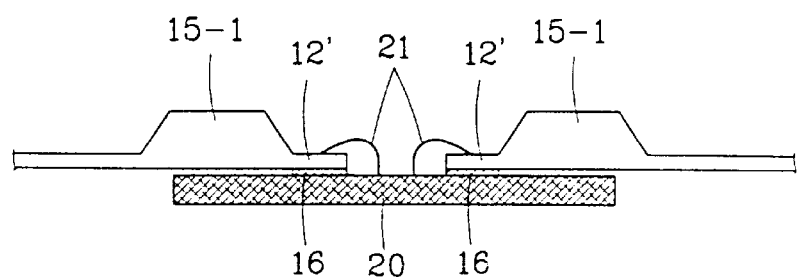

Next, as shown in FIG. 5B, an insulating double-sided tape is bonded on the bottom surfaces of the leads 12'. Using the adhesive strength of the double-sided tape, the semiconductor chip 20 having center pads (not illustrated) is bonded on the bottom surfaces of the leads such that the center pads thereof are exposed through the plurality of leads 12' bonded at the sides of the top surfaces of the semiconductor chip 20. The center pads of the semiconductor chip 20 and the leads 12' are connected through a plurality of conductive wires 21. As can be appreciated, the center pads can be connected to the leads by solder bumps.

Figure 5C:
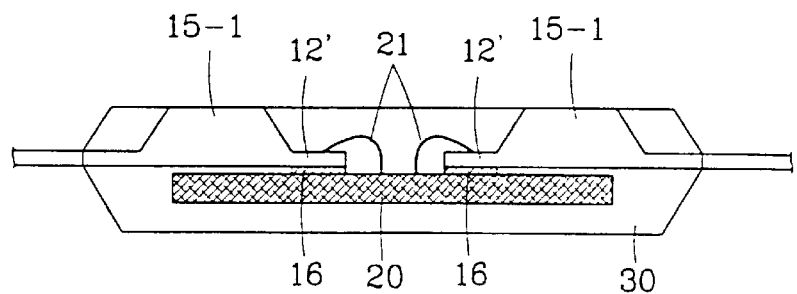
Figure 5D:
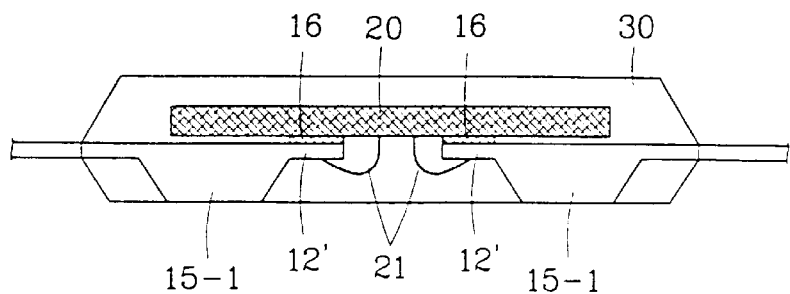

Then, as shown in FIG. 5C, the semiconductor chip 20, the plurality of leads 12' and the protrusions 15-1, and the conductive wires 21 are molded and sealed with the molding resin 30. A predetermined portion of the leads 12' protruding out of the bordering portion of the molding resin 30 are cut off, resulting in a completed bottom lead semiconductor package, as shown in FIG. 5D. The molding process is performed using the molding resin 30 so that the top surfaces of the protrusion 15-1 to serve as a bottom lead are exposed to mount the substrate (not illustrated) thereon for the purpose of transmitting an electrical signal of the semiconductor chip 20 to the outside.

As shown in FIG. 5D, the bottom lead semiconductor package according to another embodiment of the present invention, includes the semiconductor chip 20 having a plurality of center pads, and the lead frame composed of a plurality of leads 12' are bonded at the sides of the top surface of the semiconductor chip 20. The protrusion 15-1 protrudes in the upper direction at the center of the top surface of the leads 12', and a plurality of wires 21 connects the chip pads formed on the semiconductor chip and the leads 12'. The molding resin 30 molds the chip 20 so that the top surface of the protrusion 15-1 is exposed.

The foregoing embodiment is merely exemplary and not to be construed as limiting the present invention. The present scheme may be readily applied to other types of packages where the leads are exposed at a bottom surface or a top surface of the package. For example, the present invention may be applied to the packages disclosed in U.S. Pat. Nos. 5,363,279, 5,428,248, 5,326,932, 5,444,301 and 5,471,088, commonly assigned to the same assignee as this application, and whose disclosures are incorporated herein by reference. Further, the present invention discloses the chip being completely encapsulated by the molding resin. As can be appreciated, the present invention is applicable to packages which do not completely encapsulate the semiconductor chip, i.e., the molding resin packages the semiconductor chip. In the foregoing embodiments, the surfaces were referred to as upper and lower surfaces or top and bottom surfaces for convenience to illustrate the present invention in view of the figures. As can be appreciate, the surface reference is dependent upon the orientation of the package. The description of the present invention is intended to be illustrative, and not limiting the scope of the claims. Many alternatives, modifications and variations will be apparent to those skilled in the art.

I claim:

1. A lead frame for an integrated chip package, comprising:

a pair of guide rails separated by a predetermined distance;

at least one dam bar connecting said pair of guide rails;

a plurality of first leads extending from said dam bar, said first leads having a predetermined length; and a plurality of second leads, wherein a second lead is formed on a predetermined portion of a first surface of each of the first leads, and wherein each second lead is electrically coupled to its corresponding first lead.

2. The lead frame of claim 1, wherein said pair of guide rails are substantially parallel to each other, and said plurality of first leads are substantially parallel with said guide rails.

3. The lead frame of claim 1, wherein each of said plurality of second leads comprises:

a conductive adhesive attached to said predetermined portion of said first surface of said corresponding first lead; and a conductive layer bonded to said conductive adhesive on a surface opposed to said first lead.

4. The lead frame of claim 1, wherein said predetermined portion is a center portion of said first lead.

5. The lead frame of claim 3, wherein said conductive adhesive is a conductive double-sided tape.

6. The lead frame of claim 1, wherein an opening of a predetermined area is formed between adjacent dam bars.

7. The lead frame of claim 1, wherein each of said plurality of second leads is a protrusion extending beyond said first surface of said first lead and having a predetermined shape and thickness.

8. The lead frame of claim 7, wherein said predetermined shape is a trapezoidal shape.

9. The lead frame of claim 7, wherein said thickness of said protrusion is larger than a thickness of said first lead.

10. A chip package, comprising:
  a) an integrated chip having first and second surfaces, a plurality of bond pads formed on said first surface;
  b) a plurality of leads, each lead including
    i) a first lead with first and second surfaces, said first surface of said first lead being attached to said first surface of said integrated chip, and
    ii) a second lead formed on a predetermined portion of said second surface of said first lead;
  means for conductive coupling said plurality of bond pads with said plurality of leads; and
  molding resin molding said integrated chip, plurality of leads and conductive coupling means, wherein a predetermined portion of said second leads is exposed on an outside surface of said molding resin.

11. The chip package of claim 10, wherein said first and second surfaces of said first lead and integrated chip are opposing surfaces.

12. The chip package of claim 10, wherein said conductive coupling means is a plurality of wires.

13. The chip package of claim 12, wherein each wire is connected to corresponding bond pad and corresponding first lead.

14. The chip package of claim 10, wherein said molding resin encapsulates the integrated circuit.

15. The chip package of claim 10, wherein said second lead comprises:
  a conductive adhesive attached to said predetermined portion of said second surface of said first lead; and
  a conductive layer bonded to said conductive adhesive on a surface opposed to said first lead.

16. The chip package of claim 10, wherein said predetermined portion is a center portion of said first lead.

17. The chip package of claim 15, wherein said conductive adhesive is a conductive double-sided tape.

18. The chip package of claim 10, wherein said second lead is a protrusion extending beyond said second surface of said first lead and having predetermined shape and thickness.

19. The chip package of claim 18, wherein said predetermined shape is a trapezoidal shape.

20. The chip package of claim 18, wherein said thickness of said protrusion is larger than a thickness of said first lead.

21. The chip package of claim 10, wherein said plurality of bond pads is formed on a central portion of said first surface of said integrated chip.

* * * * *